US008018276B2

(12) United States Patent
Ibrahim et al.

(10) Patent No.: US 8,018,276 B2
(45) Date of Patent: Sep. 13, 2011

(54) SIGNAL PROCESSING METHOD AND POWER AMPLIFIER DEVICE

(75) Inventors: Amir S. Ibrahim, Hoffman Estates, IL (US); Magdi A. Mohamed, Schaumburg, IL (US)

(73) Assignee: Motorola Mobility, Inc., Libertyville, IL (US)

( * ) Notice: Subject to any disclaimer, the term of this patent is extended or adjusted under 35 U.S.C. 154(b) by 1384 days.

(21) Appl. No.: 11/536,188

(22) Filed: Sep. 28, 2006

(65) Prior Publication Data

US 2008/0080639 A1 Apr. 3, 2008

(51) Int. Cl.
*H03F 3/68* (2006.01)

(52) U.S. Cl. .................................... 330/124 R; 330/295

(58) Field of Classification Search .................... 330/53, 330/54, 124 R, 286, 295
See application file for complete search history.

(56) References Cited

U.S. PATENT DOCUMENTS

| | | | | |
|---|---|---|---|---|
| 5,012,200 | A | 4/1991 | Meinzer | |
| 5,256,987 | A | 10/1993 | Kibayashi et al. | |
| 6,133,788 | A | 10/2000 | Dent | |
| 6,147,553 | A | 11/2000 | Kolanek | |
| 6,311,046 | B1 | 10/2001 | Dent | |
| 6,690,233 | B2 * | 2/2004 | Sander | 330/124 R |
| 6,737,914 | B2 * | 5/2004 | Gu | 330/124 R |
| 7,091,774 | B1 * | 8/2006 | Smiley | 330/124 R |
| 7,242,245 | B2 * | 7/2007 | Burns et al. | 330/124 R |
| 2005/0116786 | A1 | 6/2005 | Harron et al. | |

FOREIGN PATENT DOCUMENTS

WO 2004023647 A1 3/2004

OTHER PUBLICATIONS

PCT Search Report dated Dec. 11, 2007.

* cited by examiner

*Primary Examiner* — Khanh Nguyen

(57) ABSTRACT

A signal processing method and power amplifier device are disclosed. The method may include receiving a signal to be transmitted, decomposing an original signal into a plurality of smaller constant-amplitude signals, wherein a vector sum each of the smaller constant-amplitude signals equals the original signal, amplifying the smaller constant-amplitude signals by an amplification factor using a plurality of amplifiers, wherein one or more of the plurality of amplifiers are enabled based on the amplitude of the original signal, combining the amplified smaller constant-amplitude signals into the original signal, the original signal being amplified by the amplification factor, wherein the amplified original signal is transmitted.

17 Claims, 5 Drawing Sheets

SIGNAL PROCESSING METHOD AND POWER AMPLIFIER DEVICE

BACKGROUND OF THE INVENTION

1. Field of the Invention

The present invention relates to power amplifiers, and in particular, to a signal processing method and power amplifier device that utilize constant-amplitude decomposed signals.

2. Introduction

Power amplifiers are used in a wide variety of applications, such as in communications systems for increasing the signal strength of wireless transmissions from a base station to a wireless handset while reducing interference. In an ideal linear power amplifier, the output power equals the input power multiplied by a constant that does not vary with the input power. In existing communications systems, the power amplifier is the final active component in a base station transmit path, and is, unfortunately, subject to non-linearities that add noise and cause distortion. In particular, conventional amplifiers become quickly and significantly non-linear at relatively low output and this often forces designers to trade-off efficiency for linearity.

SUMMARY OF THE INVENTION

A signal processing method and power amplifier device are disclosed. The method may include receiving a signal to be transmitted, decomposing an original signal into a plurality of smaller constant-amplitude signals, wherein a vector sum each of the smaller constant-amplitude signals equals the original signal, amplifying the smaller constant-amplitude signals by an amplification factor using a plurality of amplifiers, wherein one or more of the plurality of amplifiers are enabled based on the amplitude of the original signal, combining the amplified smaller constant-amplitude signals into the original signal, the original signal being amplified by the amplification factor, wherein the amplified original signal is transmitted.

BRIEF DESCRIPTION OF THE DRAWINGS

In order to describe the manner in which the above-recited and other advantages and features of the invention can be obtained, a more particular description of the invention briefly described above wilt be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE INVENTION

Additional features and advantages of the invention wilt be set forth in the description which follows, and in part wilt be obvious from the description, or may be learned by practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth herein.

Various embodiments of the invention are discussed in detail below. While specific implementations are discussed, it should be understood that this is done for illustration purposes only. A person skilled in the relevant art will recognize that other components and configurations may be used without parting from the spirit and scope of the invention.

The present invention comprises a variety of embodiments, such as an apparatus, method and system, and other embodiments that relate to the basic concepts of the invention.

Figure 1:
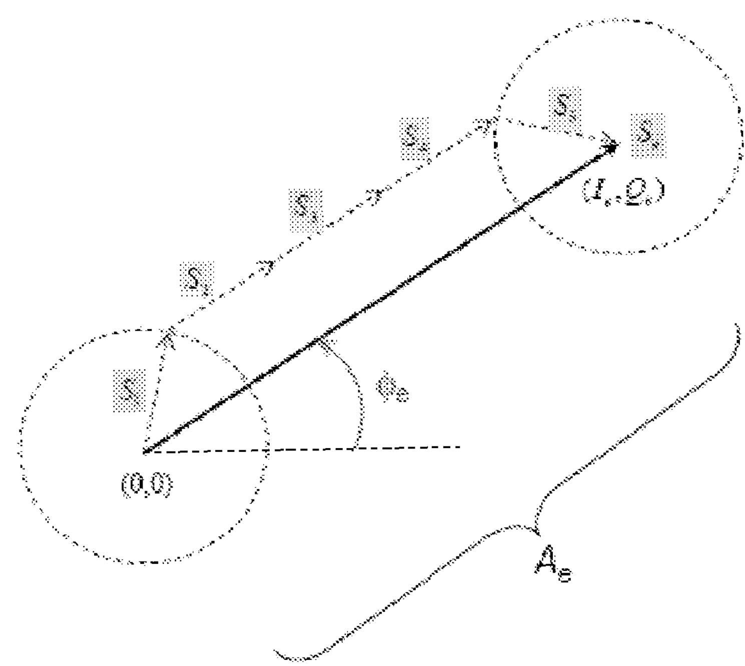
FIG. 1 illustrates an exemplary diagram of a signal that has been decomposed into a series of individually amplitude-controlled signals in accordance with a possible embodiment of the invention.

FIG. 1 illustrates an exemplary diagram of a signal $S_e$ that has been decomposed into a series of individually amplitude-controlled signals in accordance with a possible embodiment of the invention. FIG. 1 is just snapshot of a vector presentation of a signal $S_e$ that travels from an origin (0, 0) to position ($I_e$, $Q_e$) every few nanoseconds. The position of ($I_e$, $Q_e$) wilt change because the signal is changing as information is transmitted.

Conventional methods send the entire signal $S_e$ from (0, 0) to ($I_e$, $Q_e$) through a power amplifier. The original signal $S_e$ will move as time moves and it will change in amplitude (e.g., rotate, get shorter, get longer, etc.) However, these amplitude changes are not good for the quality of a power amplifier signal output.

Therefore, instead of sending the whole signal, FIGS. 1-4 and the corresponding discussion concerns dividing the signal vector $S_e$ into smaller signal vectors of fixed or constant amplitude, which are labeled $S_1$, $S_2$, $S_3$, etc. The phases of the smaller signal $S_1$, $S_2$, $S_3$, etc. may vary with time. Thus, the original signal $S_e$ is decomposed or out-phased into multiple constant amplitude signals $S_1$, $S_2$, $S_3$, etc. and those smaller signals will be sent into parallel amplifiers separately, as discussed in detail below.

Figure 2:
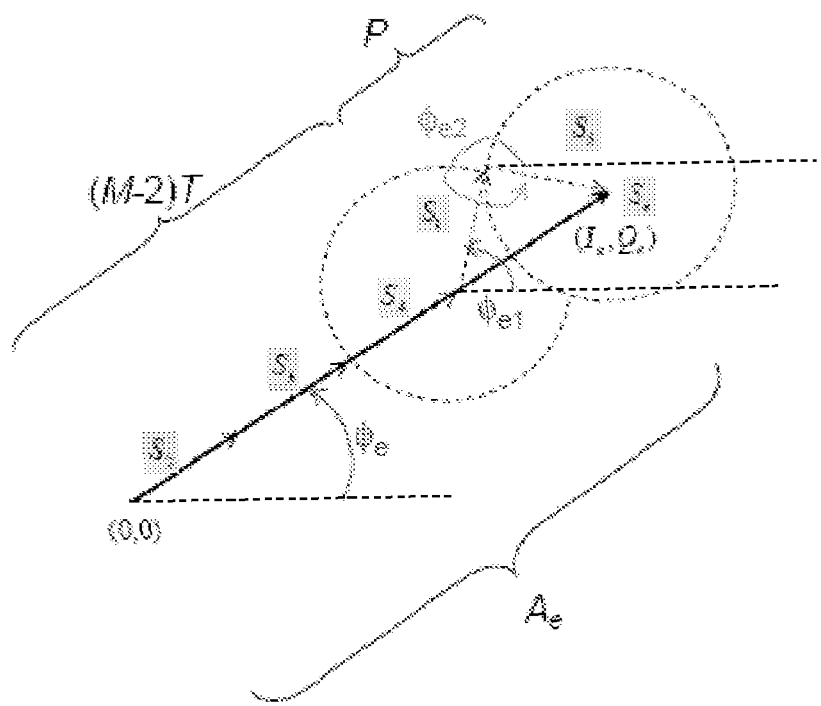
FIG. 2 illustrates another exemplary block diagram of an exemplary signal decomposition process in accordance with a possible embodiment of the invention.

FIG. 2 shows another example of the decomposition process discussed in relation to FIG. 1. The smaller vectors $S_1$, $S_2$, $S_3$, etc. have constant amplitude but are variable in phase and therefore as $S_e$ changes, the smaller signals are not actually changing in amplitude. As shown in FIG. 2, the $S_1$ and $S_5$ branches are decomposed or out-phased to produce the desired effect. However, the vector sum of the smaller constant-amplitude signals $S_1$, $S_2$, $S_3$, etc. will always equal the original signal $S_e$.

Figure 3:
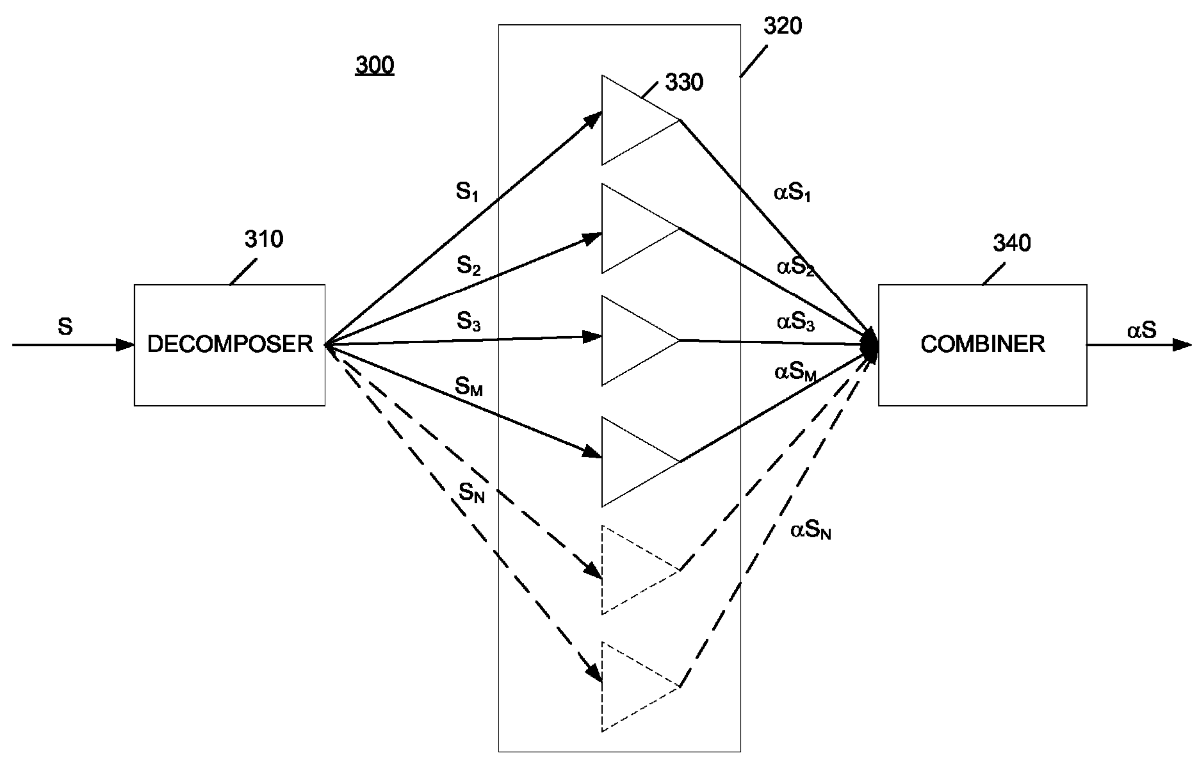
FIG. 3 illustrates an exemplary block diagram of a power amplifier device in accordance with a possible embodiment of the invention.

FIG. 3 illustrates an exemplary block diagram of a possible power amplifier device 100 in accordance with a possible embodiment of the invention. The power amplifier device 100 may include a decomposer 310, a phased amplifier array 320 that includes a plurality of amplifiers 330, and a combiner 340. As discussed above, the decomposer 310 may be any digital processing component, for example, that will calculate the smaller signal vectors $S_1$, $S_2$, $S_3$, etc. and then will send those smaller signal vectors through modulation to the amplifier array 320. The amplifier array 320 may represent an adaptive power amplifier array, for example, and may include a plurality of amplifiers 330. Since the amplitude of the small signal vectors $S_1$, $S_2$, $S_3$, etc. is constant, the amplifiers 330 do not need to be linear because the constant-amplitude signals will not cause significant distortion.

The combiner 340 may represent any circuitry or device that will combine the smaller signals $S_1$, $S_2$, $S_3$, etc. into the original signal $S_e$ using any method known to one of skill in the art. For example, the combiner 340 may represent an on-demand combiner that will operate so that if a number of amplifier branches are disabled, a corresponding number of combining branches are disabled as well.

For illustrative purposes, the power amplification process will be described below in relation to the block diagram shown in FIG. 3.

Figure 4:
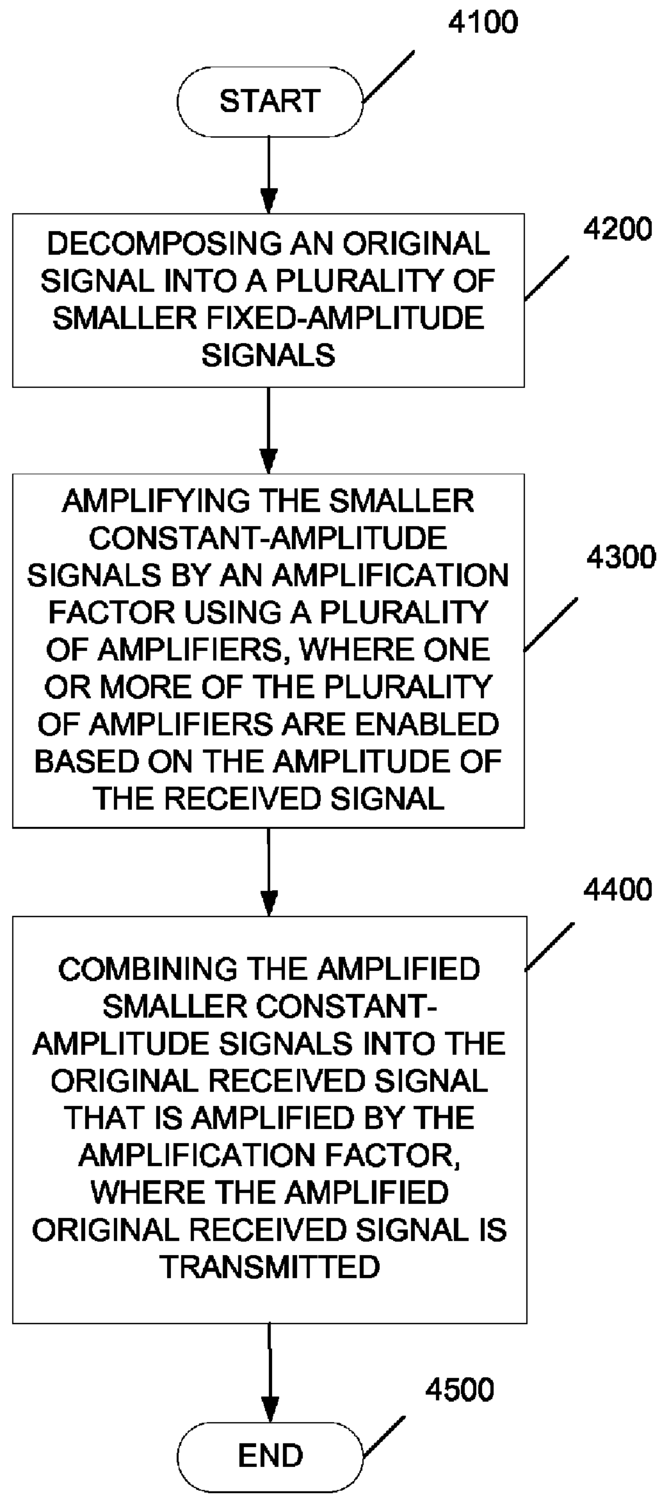
FIG. 4 illustrates an exemplary flowchart showing one possible signal processing process in accordance with one possible embodiment of the invention.

FIG. 4 is an exemplary flowchart illustrating some of the basic steps associated with a possible power amplification process in accordance with a possible embodiment of the invention. The process begins at step 4100 and continues to step 4200 where the power amplifier device 300 receives a signal with maximum amplitude value of 1 (termed "an original signal, for ease of discussion) to be transmitted. At step 4300, the decomposer 310 decomposes the original signal into a plurality of smaller constant-amplitude signals, such that the vector sum each of the smaller constant-amplitude signals equals the original signal.

At step 4400, the amplifier array 320 receives the plurality of decomposed signals and amplifies the smaller constant-amplitude signals by an amplification factor $\alpha$. In this process, one or more of the plurality of amplifiers 330 in the amplifier array 320 are enabled and some of the amplifiers 330 may be disabled based on the amplitude of the original signal.

Figure 5:
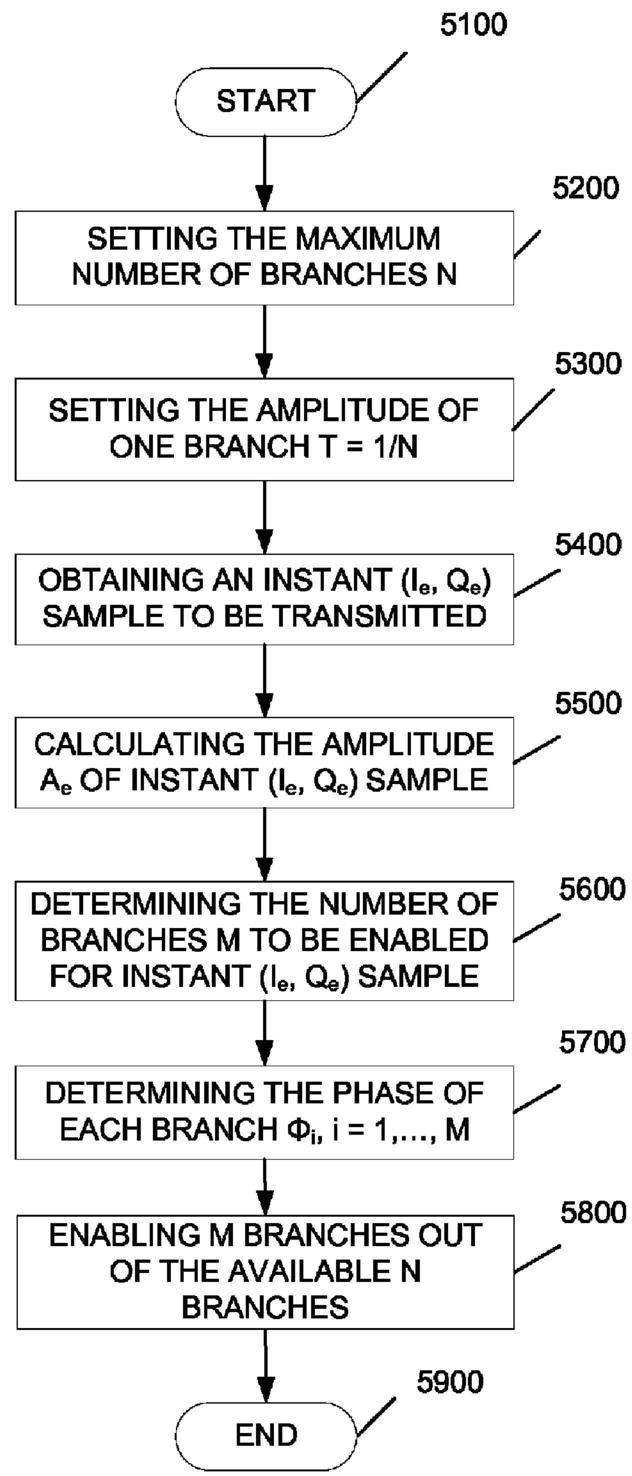
FIG. 5 illustrates an exemplary flowchart for determining the optimal number of operating branches.

The process of enabling one or more of the amplifiers 330 in the amplifier array 320 may be performed by any algorithm or method known to those of skill in the art. An example of such a method is shown in FIG. 5. The process begins at step 5100, and at step 5100, the maximum number of amplifiers 330 and corresponding amplifier branches in the amplifier array 320 is set at N. At step 5200, 1/N is set as the amplitude T of each of the smaller constant-amplitude signals being input to one of the amplifier 330 branches.

At step 5400, an instant signal sample ($I_e$, $Q_e$) to be transmitted is obtained. At step 5500, from the instant original signal ($I_e$, $Q_e$) sample to be transmitted its amplitude is determined (calculated or obtained) as $A_e=\sqrt{I_e^2+Q_e^2}$. At step 5600, the number of amplifier 330 branches in the amplifier array 320 to be enabled M is determined as $M=1+\text{floor}(A_e/T)$ where $\text{floor}(A_e/T)$ is the integer part of $(A_e/T)$. At step 5700, the phase of constant-amplitude smaller signal for each amplifier 330 branch is determined $\Phi_i$, i=1, . . . , M, the process of which is discussed below with respect to FIG. 6. At step 5800, M out of N total branches are to be enabled in the amplifier array 320 and the remainder will be disabled. The process goes to step 5900 and ends.

Returning to FIG. 4, at step 4500, the combiner 340 receives the plurality of amplified smaller constant-amplitude signals from the plurality of amplifiers 330 in the amplifier array 320 and combines the amplified smaller constant-amplitude signals back into the original signal. The original signal is effectively amplified by the amplification factor $\alpha$ used by the amplifier array 320. The combiner 340 forwards the amplified original signal for transmission. The process goes to step 4600 and ends.

Figure 6:
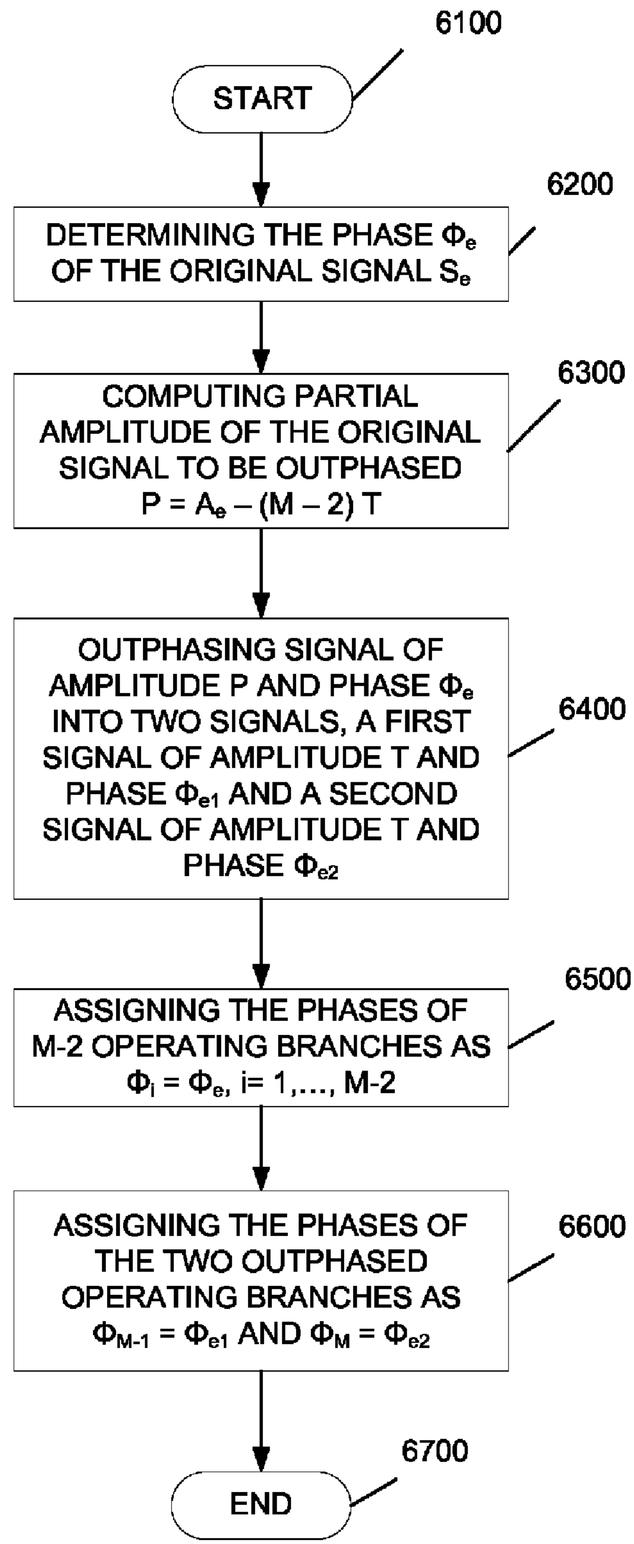
FIG. 6 illustrates an exemplary flowchart for determining the phase of each operating branch.

FIG. 6 illustrates an exemplary flowchart for one possible method of determining the phase of the constant-amplitude smaller signals each amplifier 330 operating branch in the amplifier array 320, from step 5700 above. The process begins at step 6100, and at step 6200, the phase $\Phi_e$ of the original signal $S_e$ is determined. At step 6300, the partial amplitude of the original signal $S_e$ to be outphased is computed as $P=A_e-(M-2)T$. At step 6400, the signal of amplitude P and phase $\Phi_e$ is outphased into two signals, a first signal of amplitude T and phase $\Phi_{e1}$ and a second signal of amplitude T and phase $\Phi_{e2}$.

At step 6500, the phases of M−2 operating branches are assigned as $\Phi_i=\Phi_e$, i=1, . . . , M−2. At step 6600, the phases of the two outphased operating branches are assigned as $\Phi_{M-1}=\Phi_{e1}$, and $\Phi_M=\Phi_{e2}$ (NOTE THAT I CHANGED THE SUBSCRIPT HERE). The process then goes to step 6700 and ends.

Although the above description may contain specific details, they should not be construed as limiting the claims in any way. Other configurations of the described embodiments of the invention are part of the scope of this invention. For example, the principles of the invention may be applied to each individual user where each user may individually deploy such a system. This enables each user to utilize the benefits of the invention even if any one of the large number of possible applications do not need the functionality described herein. In other words, there may be multiple instances of the power amplifier device 300 in FIG. 1 each processing the content in various possible ways. It does not necessarily need to be one system used by all end users. Accordingly, the appended claims and their legal equivalents should only define the invention, rather than any specific examples given.

We claim:

1. A method for processing signals for transmission, comprising:

decomposing an original signal into a plurality of smaller constant-amplitude signals with variable phases, wherein a vector sum of each of the smaller constant-amplitude signals equals the original signal;

amplifying the smaller constant-amplitude signals by an amplification factor using a plurality of amplifiers, wherein one or more of the plurality of amplifiers are enabled based on an amplitude of the original signal, wherein a number of the plurality of amplifiers that are enabled for amplification is determined by:

setting the maximum number of amplifiers available N, wherein 1/N equals the amplitude T of one smaller constant-amplitude signal being input to one of the amplifiers;

determining the amplitude $A_e$ of the original signal;

determining a number of amplifiers to be enabled M, where $M=1+\text{floor}(A_e/T)$ where $\text{floor}(A_e/T)$ is the integer part of $(A_e/T)$ and T is an amplitude of one smaller constant-amplitude signal being input to one of the amplifiers; and determining the phase $\Phi_i$ of each operating branch i=1, . . . , M; and combining the amplified smaller signals into the original signal, the original signal being amplified by the amplification factor, wherein the amplified original signal is transmitted.

2. The method of claim 1, wherein the phase $\Phi_i$ of each operating branch i=1, . . . , M is determined by:

determining the phase $\Phi_e$ of the original signal $S_e$;

computing the partial amplitude of the original signal $S_e$ to be outphased as $P=A_e-(M-2)\,T$;

outphasing at least a portion of the original signal $S_e$ of amplitude P and phase $\Phi_e$ into two signals, a first signal of amplitude T and phase $\Phi_{e1}$ and a second signal of amplitude T and phase $\Phi_{e2}$;

assigning the phases of M−2 operating branches as $\Phi_i=\Phi_e$, i=1, . . . , M−2; and assigning the phases of the two outphased operating branches as $\Phi_{M-1}=\Phi_{e1}$, and $\Phi_M=\Phi_{e2}$.

3. The method of claim 1, wherein the plurality of amplifiers are part of an amplifier array.

4. The method of claim 1, wherein at least one or more of the plurality of amplifiers are non-linear.

5. The method of claim 1, wherein the smaller constant amplitude signals are represented by vectors with variable-phase and constant-amplitude components.

6. The method of claim 1, wherein the amplified original signal is at least one of transmitted and received over a wireless communications network.

7. A power amplifier device that receives an original signal to be transmitted, comprising:

a decomposer that decomposes the original signal into a plurality of smaller constant-amplitude signals, wherein a vector sum each of the smaller constant-amplitude signals equals the original signal;

a plurality of amplifiers that amplifies the smaller constant-amplitude signals by an amplification factor, wherein one or more of the plurality of amplifiers are enabled based on an amplitude of the original signal;

a combiner that combines the amplified smaller constant-amplitude signals into the original signal, the original signal being amplified by the amplification factor, wherein the amplified original signal is transmitted;

wherein a number of the plurality of amplifiers that are enabled for amplification is determined by:

setting the maximum number of amplifiers available N, wherein 1/N equals the amplitude T of one smaller constant-amplitude signal being input to one of the amplifiers;

determining the amplitude $A_e$ of the original signal; and determining a number of amplifiers to be enabled M, where M=1+floor($A_e$/T) where floor($A_e$/T) is the integer part of ($A_e$/T) and T is an amplitude of one smaller constant-amplitude signal being input to one of the amplifiers; and determining the phase $\Phi_i$ of each operating branch i=1, . . . , M.

8. The power amplifier device of claim 7, wherein the phase $\Phi_i$ of each operating branch i=1, . . . , M is determined by:

determining the phase $\Phi_e$ of the original signal $S_e$;

computing the partial amplitude of the original signal $S_e$ to be outphased as P=$A_e$−(M−2) T;

outphasing at least a portion of the original signal $S_e$ of amplitude P and phase $\Phi_e$ into two signals, a first signal of amplitude T and phase $\Phi_{e1}$ and a second signal of amplitude T and phase $\Phi_{e2}$;

assigning the phases of M−2 operating branches as $\Phi_i=\Phi_e$, i=1, . . . , M−2; and assigning the phases of the two outphased operating branches as $\Phi_{M-1}=\Phi_{e1}$, and $\Phi_M=\Phi_{e2}$.

9. The power amplifier device of claim 7, wherein the plurality of amplifiers are part of an amplifier array.

10. The power amplifier device of claim 7, wherein at least one or more of the plurality of amplifiers are non-linear.

11. The power amplifier device of claim 7, wherein the smaller constant-amplitude signals are represented by vectors with variable-phase and constant-amplitude components.

12. The power amplifier device of claim 7, wherein the amplified original signal is at least one of transmitted and received over a wireless communications network.

13. An electronic device that transmits signals over a wireless communications network, comprising:

a power amplifier device that receives an original signal to be transmitted, comprising: a decomposer that decomposes the original signal into a plurality of smaller constant-amplitude signals, wherein a vector sum each of the smaller constant-amplitude signals equals the original signal;

a plurality of amplifiers that amplifies the smaller constant-amplitude signals by an amplification factor, wherein one or more of the plurality of amplifiers are enabled based on an amplitude of the original signal;

a combiner that combines the amplified smaller constant-amplitude signals into the original signal, the original signal being amplified by the amplification factor; and a transmitter that transmits the amplified original signal;

wherein a number of the plurality of amplifiers that are enabled for amplification is determined by:

setting the maximum number of amplifiers available N, wherein 1/N equals the amplitude T of one smaller constant-amplitude signal being input to one of the amplifiers;

determining the amplitude $A_e$ of the original signal; and determining a number of amplifiers to be enabled M, where M=1+floor($A_e$/T) where floor($A_e$/T) is the integer part of ($A_e$/T) and T is an amplitude of one smaller constant-amplitude signal being input to one of the amplifiers; and determining the phase $\Phi_i$ of each operating branch i=1, . . . , M.

14. The electronic device of claim 13, wherein the phase $\Phi_i$ of each operating branch i=1, . . . , M is determined by:

determining the phase $\Phi_e$ of the original signal $S_e$;

computing the partial amplitude of the original signal $S_e$ to be outphased as P=$A_e$−(M−2) T;

outphasing at least a portion of the original signal $S_e$ of amplitude P and phase $\Phi_e$ into two signals, a first signal of amplitude T and phase $\Phi_{e1}$ and a second signal of amplitude T and phase $\Phi_{e2}$;

assigning the phases of M−2 operating branches as $\Phi_i=\Phi_e$, i=1, . . . , M−2; and assigning the phases of the two outphased operating branches as $\Phi_{M-1}=\Phi_{e1}$, and $\Phi_M=\Phi_{e2}$.

15. The electronic device of claim 13, wherein the plurality of amplifiers are part of an amplifier array.

16. The electronic device of claim 13, wherein at least one or more of the plurality of amplifiers are non-linear.

17. The electronic device of claim 13, wherein the smaller constant-amplitude signals are represented by vectors with variable-phase and constant-amplitude components.

* * * * *